(12) United States Patent
Zhao

(10) Patent No.: US 12,218,147 B2
(45) Date of Patent: Feb. 4, 2025

(54) CONNECTION STRUCTURE FOR LCD CLOCK CIRCUIT

(71) Applicants: BEIJING BOE DISPLAY TECHNOLOGY CO., LTD., Beijing (CN); BOE TECHNOLOGY GROUP CO., LTD., Beijing (CN)

(72) Inventor: Chongyang Zhao, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 742 days.

(21) Appl. No.: 17/417,293

(22) PCT Filed: Dec. 29, 2020

(86) PCT No.: PCT/CN2020/140884
§ 371 (c)(1),
(2) Date: Jun. 22, 2021

(87) PCT Pub. No.: WO2021/184909
PCT Pub. Date: Sep. 23, 2021

(65) Prior Publication Data
US 2022/0328527 A1    Oct. 13, 2022

(30) Foreign Application Priority Data

Mar. 19, 2020 (CN) .......................... 202010197224.1

(51) Int. Cl.
*H01L 27/12* (2006.01)
*G09G 3/36* (2006.01)

(52) U.S. Cl.
CPC ......... *H01L 27/124* (2013.01); *G09G 3/3677* (2013.01); *G09G 2310/0286* (2013.01)

(58) Field of Classification Search
CPC .................................................... H01L 27/124
See application file for complete search history.

(56) References Cited

U.S. PATENT DOCUMENTS 9,865,664 B2    1/2018  Matsubara
2008/0265254 A1  10/2008  Nishiura
(Continued)

FOREIGN PATENT DOCUMENTS

CN    102709240    10/2012
CN    105981147     9/2016
(Continued)

OTHER PUBLICATIONS

Office action from Chinese Application No. 202010197224.1 dated Mar. 23, 2021.
(Continued)

*Primary Examiner* — Peter Bradford
(74) *Attorney, Agent, or Firm* — Calfee, Halter & Griswold LLP

(57) ABSTRACT

An array substrate comprises a substrate body, a plurality of first wires, a plurality of second wires and a plurality of connecting electrodes. The plurality of first wires are provided on a first conductive layer; the plurality of second wires are provided on a second conductive layer, and the first conductive layer and the second conductive layer are located in different layers; the plurality of connecting electrodes are provided on a third conductive layer, and the connecting electrodes are respectively connected to the first wires and the second wires so as to connect the corresponding first wires and second wires, wherein orthographic projection areas of the connecting electrodes on the base substrate are not exactly the same. The array substrate may solve a problem of inconsistent signal delays on the second wires due to inconsistent lengths of the second wires.

20 Claims, 15 Drawing Sheets

(56) References Cited

U.S. PATENT DOCUMENTS

2016/0358988 A1    12/2016  Matsubara
2017/0200420 A1*   7/2017  No ...................... G06F 13/1689
2018/0308445 A1*  10/2018  Park ...................... G09G 3/3677
2021/0327383 A1*  10/2021  He ....................... G09G 3/3677

FOREIGN PATENT DOCUMENTS

| CN | 108182921 | 6/2018 |
|---|---|---|
| CN | 110707096 | 1/2020 |
| CN | 111384066 | 7/2020 |
| JP | 2008275937 | 11/2008 |
| JP | 5044273 | 10/2012 |
| WO | 2013163880 | 11/2013 |

OTHER PUBLICATIONS

Office action from Chinese Application No. 202010197224.1 dated Aug. 27, 2021.
Allowance from Chinese Application No. 202010197224.1 dated Dec. 3, 2021.
International Search Report from PCT/CN2020/140884 dated Mar. 18, 2021.
Written Opinion from PCT/CN2020/140884 dated Mar. 18, 2021.

* cited by examiner

United States Patent

CONNECTION STRUCTURE FOR LCD CLOCK CIRCUIT

CROSS-REFERENCE TO RELATED APPLICATIONS

This application is the national stage entry of PCT/CN2020/140884, filed on Dec. 29, 2020, which claims the priority of the Chinese patent application No. 202010197224.1 named "Array Substrate and Display Device" filed on Mar. 19, 2020, and the disclosed contents of both patent applications are hereby incorporated by reference in their entirety as a part of this application.

TECHNICAL FIELD

The present disclosure relates to the field of display technology, in particular to an array substrate and a display device.

BACKGROUND

In the field of display technology, in order to reduce the frame size of the array substrate, more and more products begin to adopt the GOA (Gate on Array) technology, that is, the gate drive circuit is integrated on the array substrate. In GOA technology, the gate drive circuit usually needs to be driven by multiple clock signals to generate a shift signal. In the related art, multiple clock wires extend along the cascade direction of the shift register unit, and the clock signal needs to be transmitted from the clock wire to the gate drive circuit through the clock lead wire. Because the clock lead wires have different lengths, the clock lead wires will generate different overlapping capacitances with other structural layers (for example, the BM area at the edge of the color film substrate), such that the clock signals produce different signal delays on different clock lead wires, finally resulting in stripe Mura on the display panel.

In the related art, in order to avoid stripe Mura on the display panel, a capacitance compensation area is usually provided in the edge wiring area of the array substrate. Each clock lead wire has a different winding length in the capacitance compensation area, so that each clock lead wire has the same length.

However, the capacitance compensation area will increase the frame width of the array substrate.

It should be noted that the information of the disclosure in the above background is only used to enhance the understanding of the background of the disclosure, and therefore may include information that does not belong to the prior art known to those of ordinary skill in the art.

SUMMARY

According to one aspect of the present disclosure, there is provided an array substrate, which includes: a base substrate, a plurality of first wires, a plurality of second wires, and a plurality of connecting electrodes. The plurality of first wires are provided on a first conductive layer; the plurality of second wires are provided on a second conductive layer, and the first conductive layer and the second conductive layer are located in different layers; and the plurality of connecting electrodes are provided on a third conductive layer. The connecting electrodes are respectively connected with the first wires and the second wires so as to connect corresponding first wires and second wires; wherein, orthographic projection areas of the connecting electrodes on the base substrate are not exactly the same.

In an exemplary embodiment of the present disclosure, at least part of the second wires have different lengths; a sum of an overlap capacitance generated between each second wire and a target structure layer and an overlap capacitance generated between the connecting electrode connected to the second wire and the target structure layer is equal.

In an exemplary embodiment of the present disclosure, the third conductive layer and the first and the second conductive layers are located in different layers, and the connecting electrodes are connected to the first wires and the second wires through via holes, respectively.

In an exemplary embodiment of the present disclosure, the array substrate includes a transistor, the first conductive layer includes a gate layer for forming a transistor gate electrode, and the second conductive layer includes a source/drain layer for forming a transistor source/drain electrode; the array substrate includes a pixel electrode, and the third conductive layer includes a pixel electrode layer for forming the pixel electrode.

In an exemplary embodiment of the present disclosure, the array substrate includes a substrate, and the second conductive layer is located on a side of the first conductive layer away from the substrate; the third conductive layer and the second conductive layer are provided in the same layer, and the connecting electrodes are connected to the first wires through via holes, and connected to the second wires in the same layer.

In an exemplary embodiment of the present disclosure, a plurality of first wires extend in a first direction and are distributed at intervals in a second direction, and the second wires extend in the second direction and are distributed at intervals in the first direction, wherein the first direction is different from the second direction.

In an exemplary embodiment of the present disclosure, the array substrate includes an edge wiring area, wherein the first wires and the second wires are located in the edge wiring area, and first ends of the second wires are connected to the first wires, and second ends of the second wires extend to an edge of the edge wiring area.

In an exemplary embodiment of the present disclosure, the first wires are clock wires in a gate drive circuit, and the second wires are clock lead wires in the gate drive circuit; the clock wires extend along a cascade direction of a shift register unit in the gate drive circuit, and are used to provide clock signals to the shift register unit; first ends of the clock lead wires are connected to the clock wires, and second ends of the clock lead wires extend to the edge of the edge wiring area so as to connect to the shift register unit in the gate drive circuit.

In an exemplary embodiment of the present disclosure, the clock wires are formed by a hollow metal grid, and the orthographic projections of the connecting electrodes on the array substrate at least coincide with the orthographic projections of a part of the metal grid on the base substrate.

According to one aspect of the present disclosure, the second wire includes a connecting portion, and the orthographic projection of the connecting portion on the base substrate at least partly coincides with the orthographic projection of the connecting electrode on the base substrate; the connecting portion includes a main body portion extending in a third direction and an extension portion connected to the main body portion, the extension portion extends in a fourth direction, and the third direction is different from the fourth direction.

According to one aspect of the present disclosure, there is provided a display device including the array substrate mentioned above.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the present disclosure, and are used to explain the principle of the present disclosure together with the specification. Obviously, the drawings in the following description are only some embodiments of the present disclosure. For those of ordinary skill in the art, other drawings can be obtained based on these drawings without creative work.

DETAILED DESCRIPTION

Figure 1:
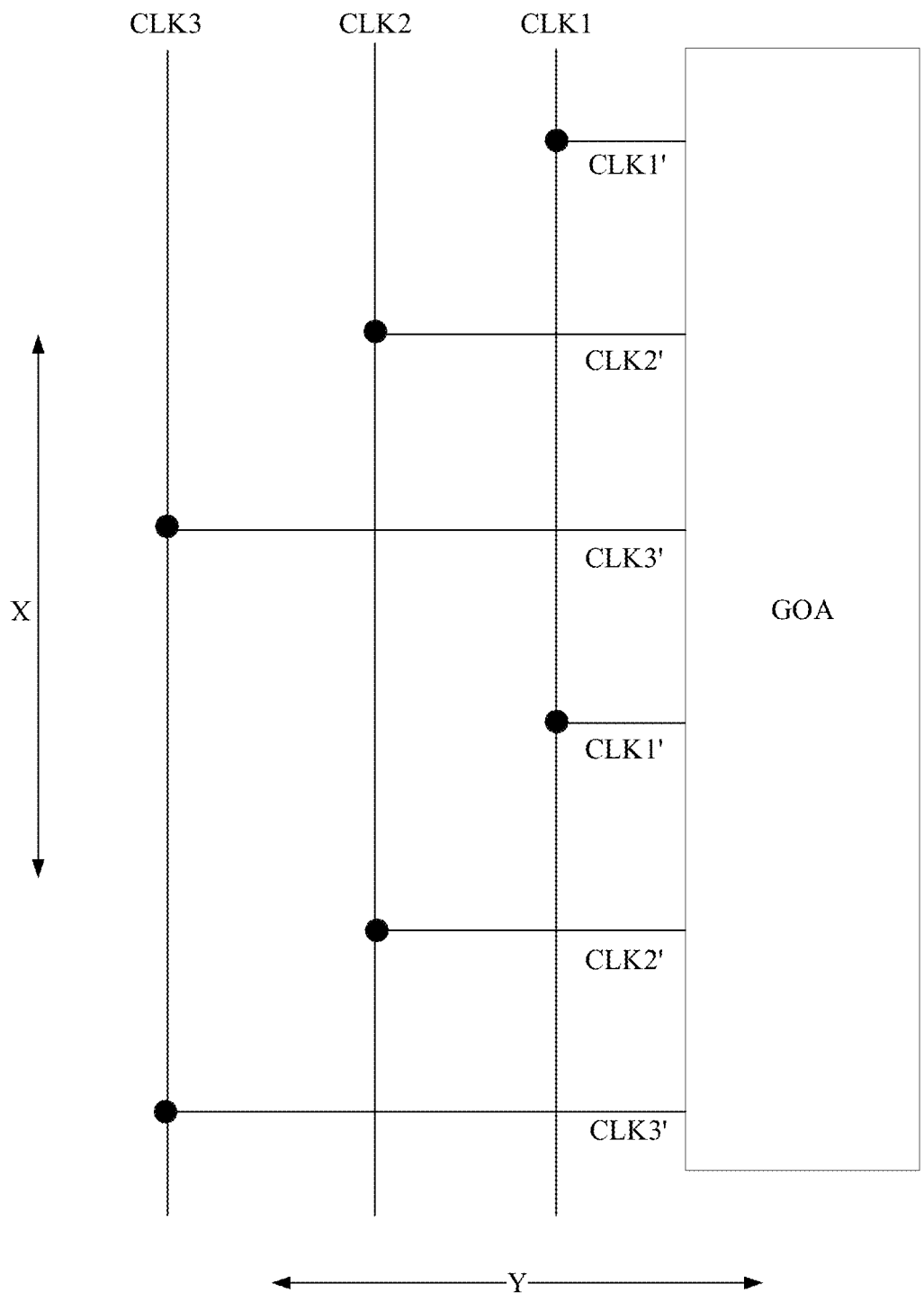
FIG. 1 is a schematic structural diagram of an array substrate in the related art.

Example embodiments will now be described more fully with reference to the accompanying drawings. However, the example embodiments can be implemented in various forms, and should not be construed as being limited to the examples set forth herein; on the contrary, these embodiments are provided to make the present disclosure more comprehensive and complete, and fully conveys the concept of the example embodiments to those skilled in the art. The described features, structures or characteristics can be combined in one or more embodiments in any suitable way. In the following description, many specific details are provided to give a sufficient understanding of the embodiments of the present disclosure. However, those of ordinary skill in the art will realize that the technical solutions of the present disclosure can be practiced without one or more of the specific details, or other methods, components, devices, steps, etc. In other cases, the well-known technical solutions are not shown or described in detail in order to avoid overwhelming the crowd and obscure all aspects of the present disclosure.

In addition, the drawings are only schematic illustrations of the present disclosure, and are not necessarily drawn to scale. The same reference numerals in the figures denote the same or similar parts, and thus their repeated description will be omitted. Some of the block diagrams shown in the drawings are functional entities and do not necessarily correspond to physically or logically independent entities. These functional entities may be implemented in the form of software, or implemented in one or more hardware modules or integrated circuits, or implemented in different networks and/or processor devices and/or microcontroller devices.

The terms "a", "an", "the" and "said" are used to indicate the presence of one or more elements/components/etc.; the terms "include" and "have" are used to mean open-ended inclusion and means that there may be additional elements/components/etc. in addition to the listed elements/components/etc. The terms "first" and "second" are only used as marks and are not a limitation on the number of objects.

Figure 2:
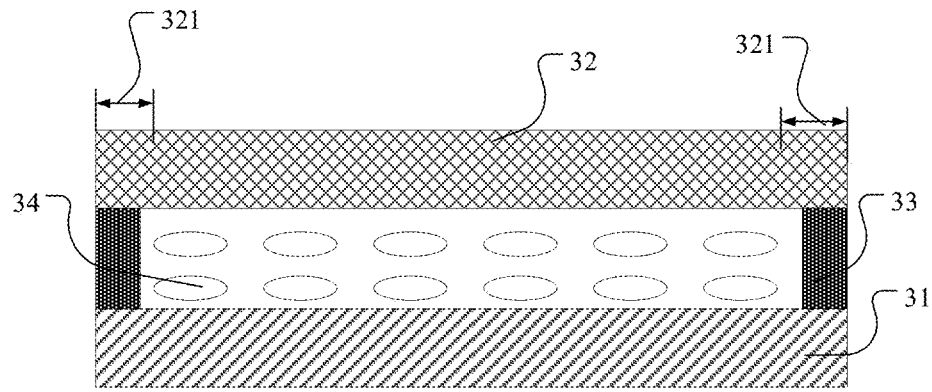
FIG. 2 is a schematic structural diagram of a display panel in the related art.

As shown in FIG. 1, it is a schematic structural diagram of an array substrate in the related art. A gate drive circuit GOA is integrated on the array substrate, and the gate drive circuit GOA needs to generate shift signals according to a plurality of different clock signals. As shown in FIG. 1, in order to input different clock signals to the gate drive circuit GOA, the array substrate needs to be provided with multiple clock wires CLK1, CLK2, CLK3 and multiple clock lead wires CLK1', CLK2', CLK3'. The multiple clock wires CLK1, CLK2, CLK3 extend along a first direction X of cascade of a shift register unit and are distributed along a second direction Y at intervals; the multiple clock lead wires CLK1', CLK2', CLK3' extend along the second direction Y and are distributed along a first direction X at intervals. Wherein, since the clock lead wires are arranged crosswise with the plurality of clock wires, in order to avoid a short circuit between the clock lead wires and the clock wires unnecessary to be connected, the clock lead wires and the clock wires may be arranged on different conductive layers. As can be seen from FIG. 1, due to different connection positions of the clock lead wires and the clock wires (the black dots are the connection positions), the clock lead wires CLK1', CLK2', CLK3' have different lengths, and different overlapping capacitances will be generated between clock lead wires of different lengths and the target structure layer, causing the clock signals to produce different signal delays on different clock lead wires, and eventually causing stripe Mura on the display panel. The target structure layer may be any structure layer that can generate overlap capacitance with the clock lead wires. As shown in FIG. 2, it is a schematic structural diagram of a display panel in the related art. The display panel may include an array substrate 31 and a color film substrate 32. The array substrate 31 and the color film substrate 32 encapsulate a liquid crystal layer 34 therebetween by an encapsulation layer 33. The edge of the color film substrate includes a BM area 321, and the target structure layer may be a BM area on the edge of the color film substrate.

Figure 3:
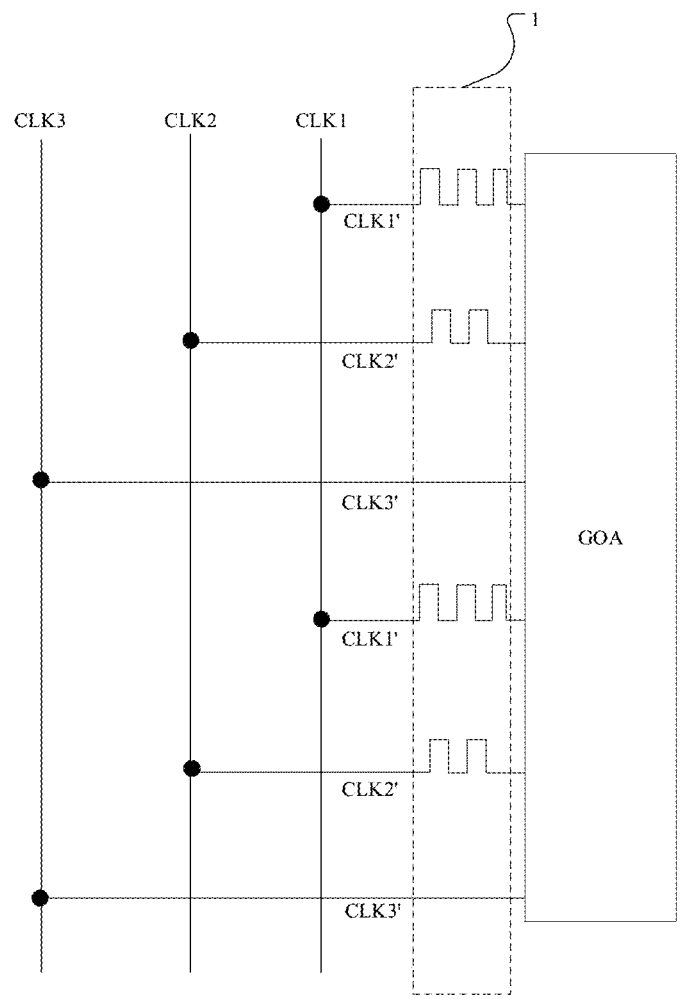
FIG. 3 is a schematic structural diagram of another exemplary embodiment of an array substrate in the related art.

In the related art, as shown in FIG. 3, it is a schematic structural diagram of another exemplary embodiment of an array substrate in the related art. In order to solve the technical problem of stripe Mura, a capacitance compensation area 1 can be provided in an edge wiring area of the array substrate. Each of the clock lead wires CLK1', CLK2', CLK3' has a different bending length in the capacitance compensation area, so that each of the clock lead wires has the same length. However, the capacitance compensation area 1 will increase the frame width of the array substrate. It should be understood that in the related art, gate drive circuits with different structures require different numbers of clock wires and clock lead wires, and at the same time, in the gate drive circuits, the shift register and the clock lead wires also have different connection modes.

Figure 4:
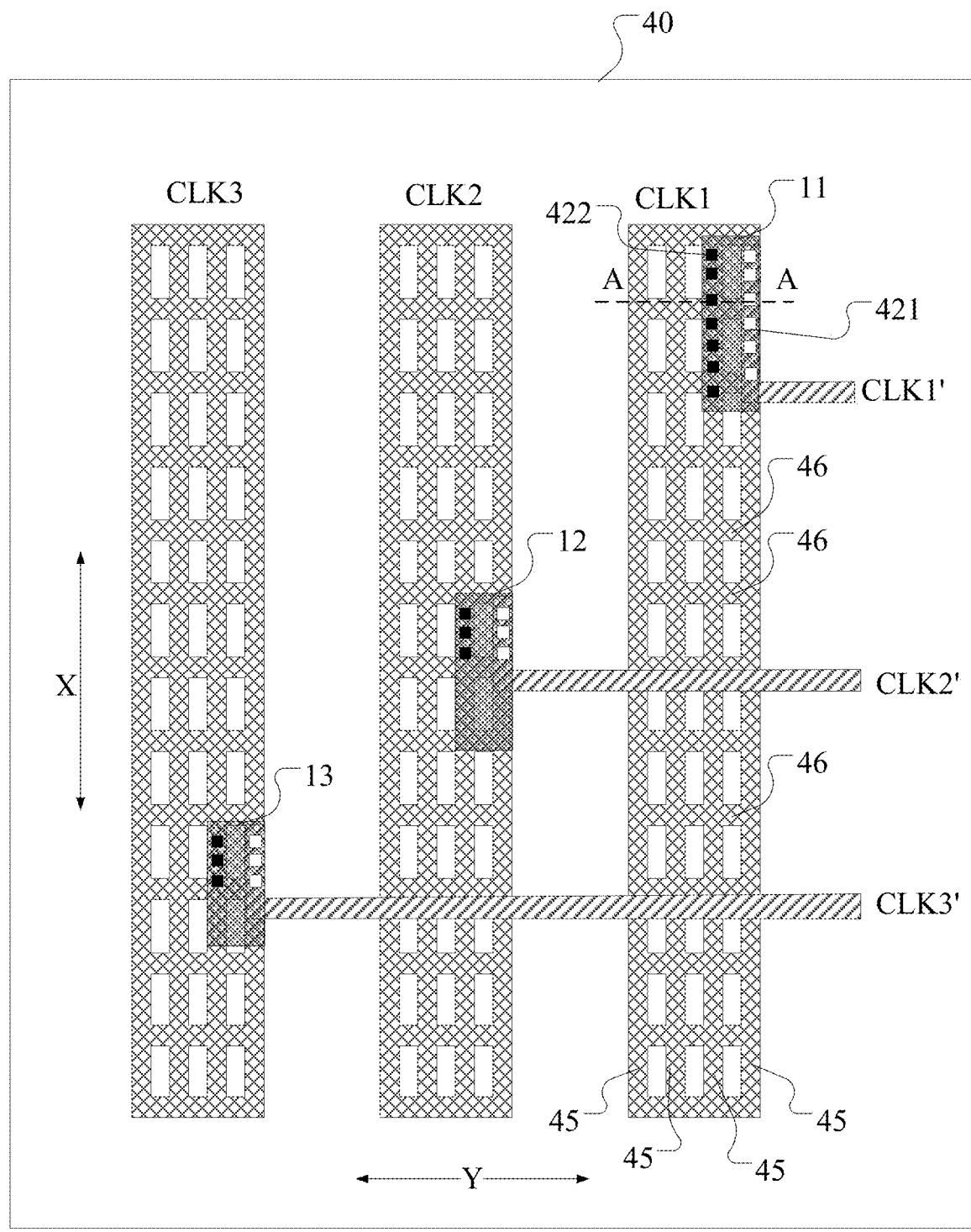
FIG. 4 is a schematic structural diagram of an exemplary embodiment of an array substrate of the present disclosure.
Figure 5:
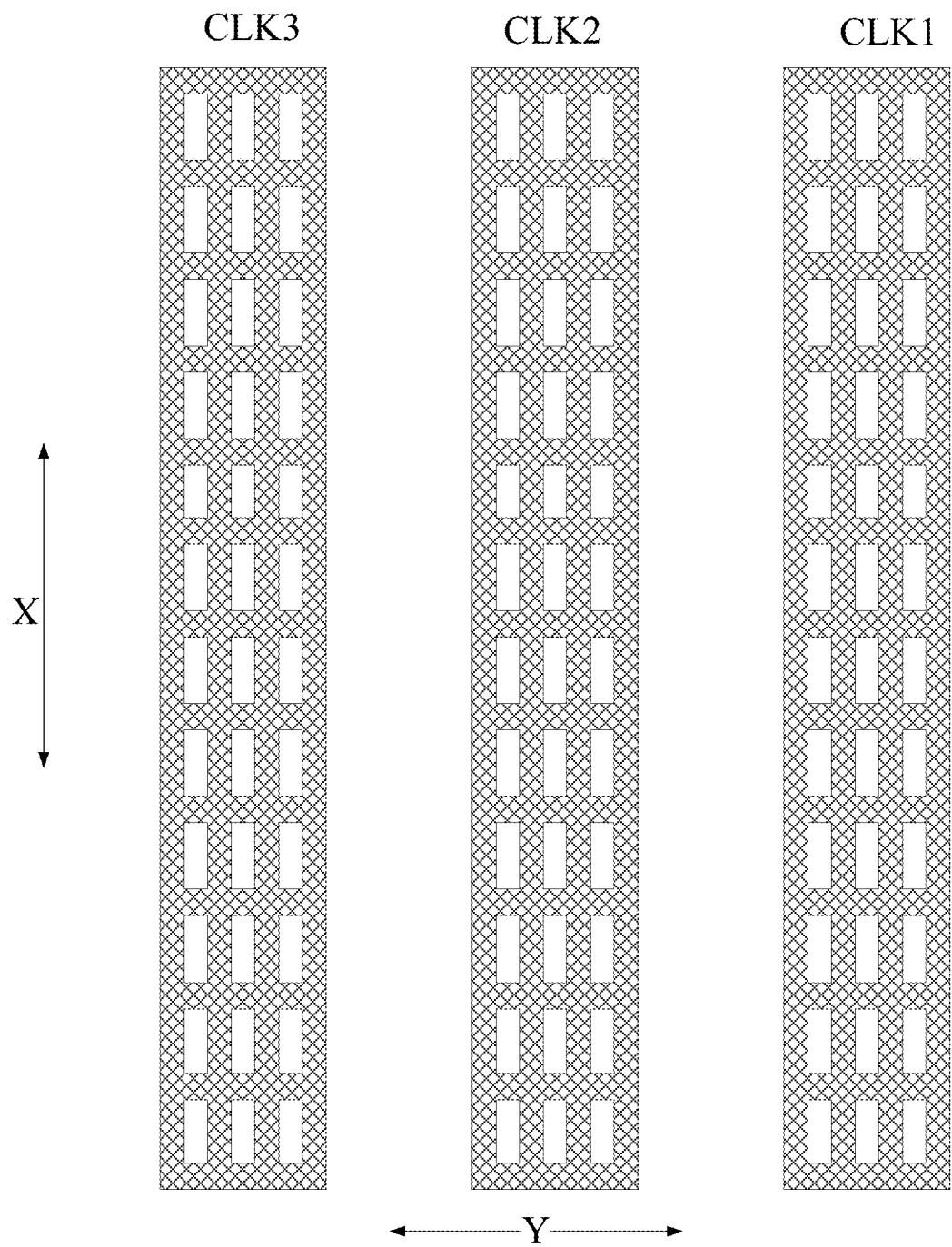
FIG. 5 is a schematic structural diagram of a first conductive layer in FIG. 4.
Figure 6:
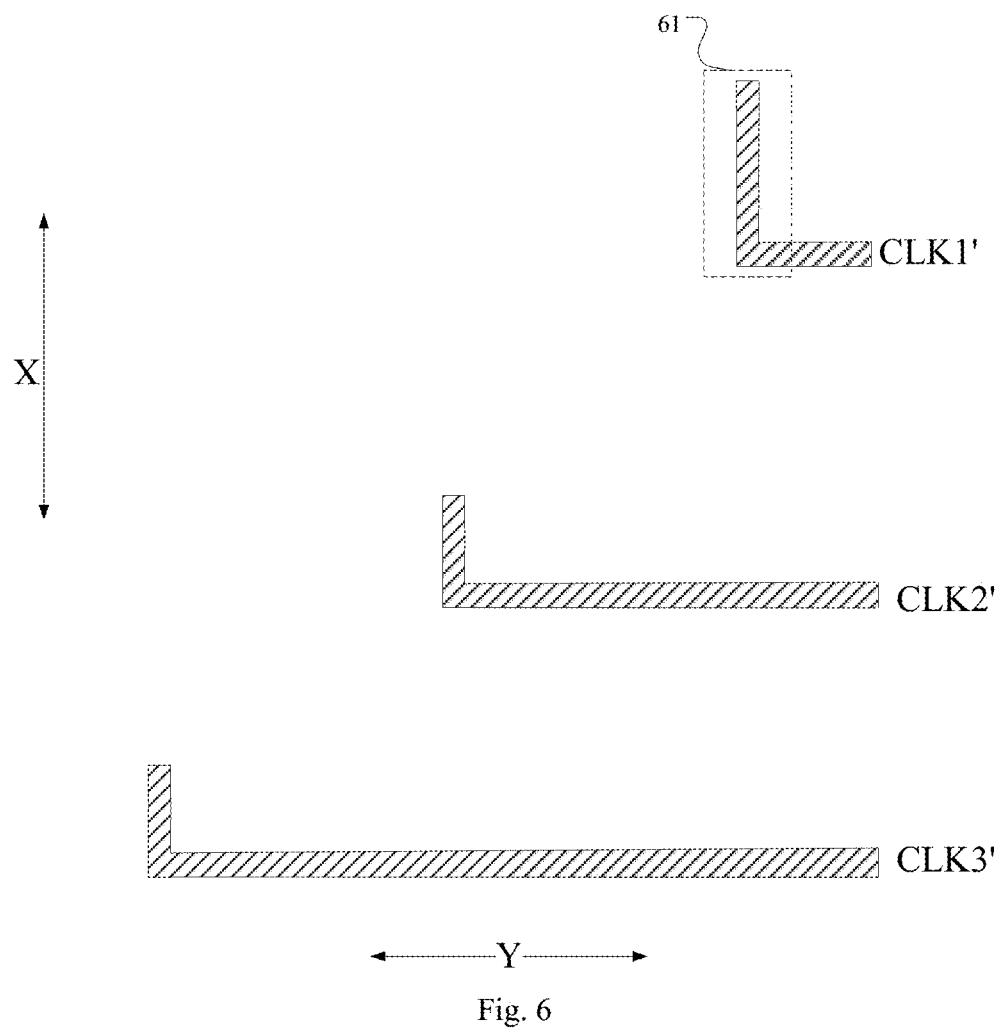
FIG. 6 is a schematic structural diagram of a second conductive layer in FIG. 4.
Figure 7:
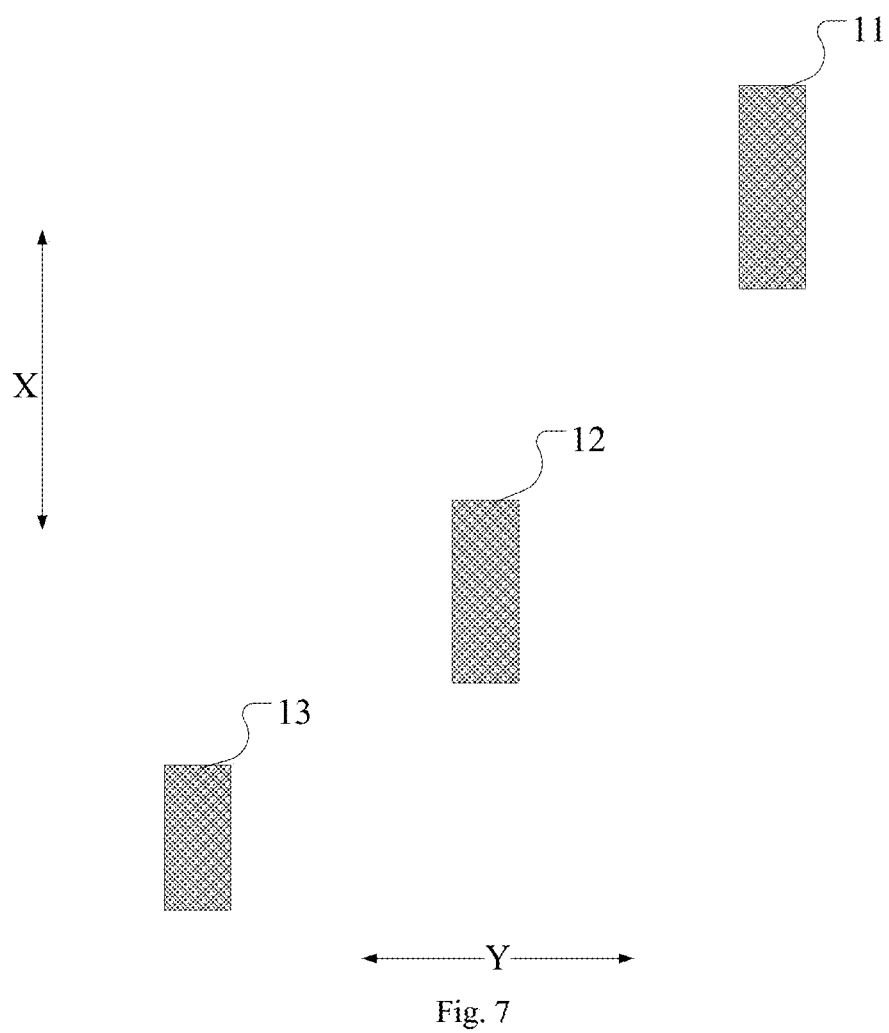
FIG. 7 is a schematic structural diagram of a third conductive layer in FIG. 4.

Based on this, the exemplary embodiment provides an array substrate, as shown in FIGS. 4-7. FIG. 4 is a schematic structural diagram of an exemplary embodiment of the array substrate of the present disclosure, FIG. 5 is a schematic structural diagram of a first conductive layer in FIG. 4, FIG. 6 is a schematic structural diagram of a second conductive layer in FIG. 4, and FIG. 7 is a schematic structural diagram of a third conductive layer in FIG. 4. The array substrate includes: a base substrate 40, a plurality of first wires CLK1, CLK2, CLK3, a plurality of second wires CLK1', CLK2', CLK3', and a plurality of connecting electrodes 11, 12, 13. The plurality of first wires are provided on the first conductive layer; the plurality of second wires are provided on the second conductive layer, the first conductive layer and the second conductive layer are located in different layers; and the plurality of connecting electrodes are provided on the third conductive layer. The connecting electrodes are respectively connected to the first wires and the second wires so as to connect corresponding first and second wires. As shown in FIG. 4, the first wire CLK1 may be connected to the second wire CLK1' through the connecting electrode 11, the first wire CLK2 may be connected to the second wire CLK2' through the connecting electrode 12, and the first wire CLK3 may be connected to the second wire CLK3' through the connecting electrode 13. Wherein, the orthographic projection areas of the connecting electrodes on the base substrate 40 are not exactly the same. As shown in FIGS. 4 and 7, the orthographic projection areas of the connecting electrodes 11, 12, and 13 on the array substrate are different.

In this exemplary embodiment, the first wires may be clock leads, and the second wires may be clock lead wires. The second wires CLK1', CLK2', CLK3' have different lengths, wherein the length of the second wire CLK1' may be less than the length of the second wire CLK2', and the length of the second wire CLK2' may be less than the length of the second wire CLK3'. Therefore, the overlap capacitance between the second wire CLK1' and a target structure layer (for example, the BM area on the edge of the color film substrate) is smaller than that between the second wire CLK2' and the target structure layer (for example, the BM area on the edge of the color film substrate); the overlap capacitance between the second wire CLK2' and the target structure layer (for example, the BM area on the edge of the color film substrate) is smaller than that between the second wire CLK3' and the target structure layer (for example, the BM area on the edge of the color film substrate). The present disclosure can compensate the overlap capacitance between the clock lead wires and the target structure layer (for example, the BM area on the edge of the color film substrate) by the connecting electrodes 11, 12, 13 with different orthographic projection areas on the base substrate, wherein the orthographic projection area of the connecting electrode 11 on the base substrate may be greater than the orthographic projection area of the connecting electrode 12 on the base substrate, and the orthographic projection area of the connecting electrode 12 on the base substrate may be greater than the orthographic projection area of the connecting electrode 13 on the base substrate. The overlap capacitance formed between the connecting electrode 11 and the target structure layer is larger than the overlap capacitance formed between the connecting electrode 12 and the target structure layer; the overlap capacitance formed between the connecting electrode 12 and the target structure layer is larger than the overlap capacitance formed between the connecting electrode 13 and the target structure layer. Because the connecting electrode 11 is electrically connected to the second wire CLK1', the connecting electrode 12 is electrically connected to the second wire CLK2', and the connecting electrode 13 is electrically connected to the second wire CLK3', the total overlap capacitance formed by the connecting electrode 11, the second wire CLK1' and the target structure may be equal to the total overlap capacitance formed by the connecting electrode 12, the second wire CLK2' and the target structure, and may be equal to the total overlap capacitance formed by the connecting electrode 13, the second wire CLK3' and the target structure. Therefore, the gate drive signals may have the same delay time on each of the second wires, thereby avoiding stripe Mura on the display panel.

In this exemplary embodiment, FIG. 4 only exemplarily shows three first wires and three second wires. It should be understood that the present disclosure does not limit the number of first wires and second wires. The first wires and the second wires can also have other numbers. In other exemplary embodiments, the first wires and the second wires may also be other signal lines that transmit signals to other drive circuits.

In this exemplary embodiment, the sum of the overlap capacitance generated between each second wire and a target structure layer and the overlap capacitance generated between a connecting electrode connected to the second wire and the target structure layer is equal. This setting can make the signal on each second wire have the same delay time. It should be understood that, in other exemplary embodiments, the sum of the overlap capacitance generated between the second wire and a target structure layer and the overlap capacitance generated between the connecting electrode connected to the second wire and the target structure layer may not be equal, and the delay time of the signal on each second wire may be adjusted by adjusting the area of the connecting electrode.

Figure 8:
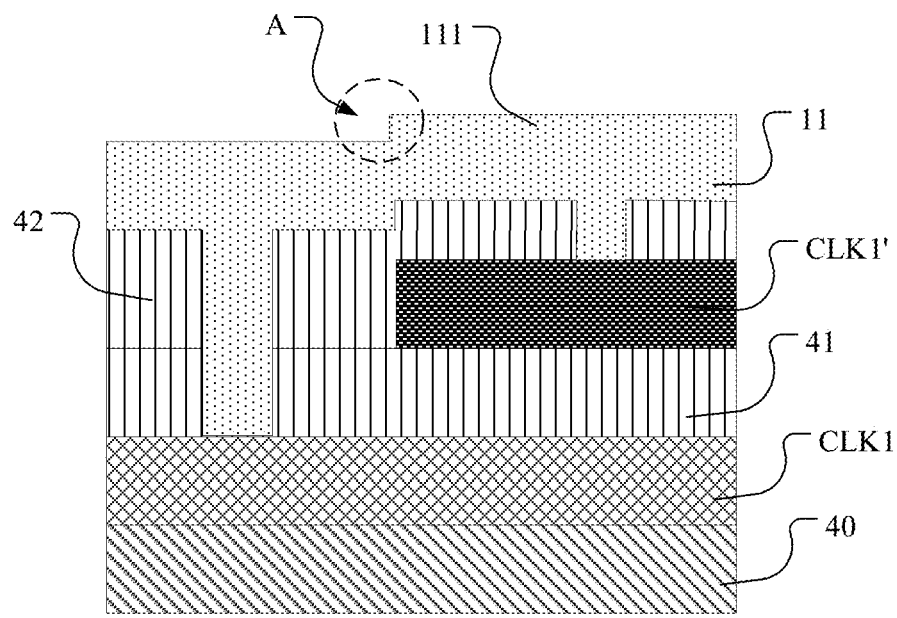
FIG. 8 is a cross-sectional view at the dotted line A-A in FIG. 4.
Figure 19:
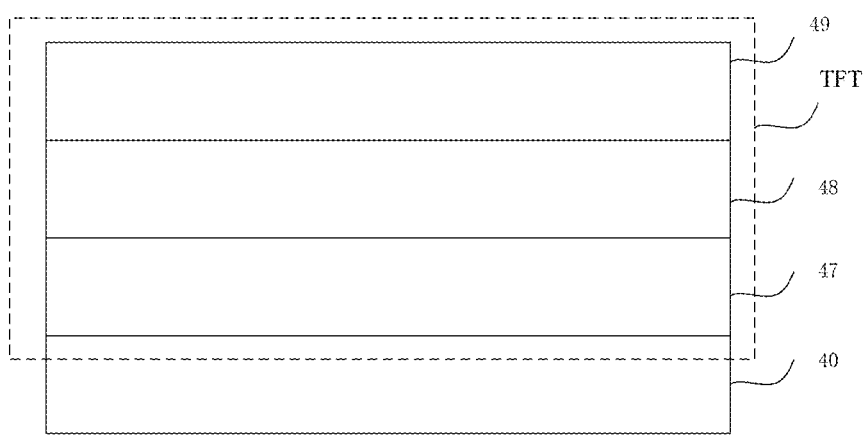
FIG. 19 is a cross-sectional view of an array substrate of the present disclosure.

In this exemplary embodiment, as shown in FIGS. 4 and 8, FIG. 8 is a cross-sectional view at the dashed line A-A in FIG. 4, and the third conductive layer (including the connecting electrode layer 11), the first conductive layer (including the first wire CLK1), the second conductive layer (including the second wire CLK1') are located in different layers. The first wire CLK1 may be provided on one side of the base substrate, and a first insulating layer 41 may be provided on one side of the first wire CLK1 away from the base substrate 40. The second wire CLK1' may be provided on one side of the first insulating layer 41 away from the base substrate 40, and a second insulating layer 42 may be provided on one side of the second wire CLK1' away from the base substrate 40. The connecting electrode 11 may be connected to the first wire CLK1 through a second via hole 422 penetrating the first insulating layer 41 and the second insulating layer 42, and the connecting electrode may be connected to the second wire CLK1' through a first via hole 421 penetrating the second insulating layer. As shown in FIG. 4, the white square hole represents the first via hole 421, and the black square hole represents the second via hole 422. Wherein, as shown in FIG. 19, the array substrate may include a transistor TFT, which may be a transistor in a pixel drive circuit. The first conductive layer may also include a gate layer 47 for forming a transistor gate electrode, and the second conductive layer may also include a source/drain layer 48 for forming a transistor source/drain electrode. The array substrate may include a pixel electrode, and the third conductive layer may further include a pixel electrode layer 49 for forming the pixel electrode. That is, the first wire may be formed in the same layer as the gate layer and formed by a single patterning process; the second wire may be formed in the same layer as the source/drain layer; the connecting electrode may be formed in the same layer as the pixel electrode layer. Wherein, the first wire CLK1 and the second wire CLK1' may be formed of metal or alloy. For example, the first wire CLK1 and the second wire CLK1' may be copper, silver, aluminum or other metals or alloys. The connecting electrode is provided on the metal layer of the pixel electrode. In one aspect, because the pixel electrode layer is close to the color film substrate, the connecting electrode may form a larger capacitance with the BM area of the color film substrate; in another aspect, the transparent connecting electrode may also facilitate curing encapsulation glue by external ultraviolet rays penetrating the array substrate when the display panel is packaged in a box; in a further aspect, in a manufacturing process of the array substrate per se, it is necessary to etch an insulating layer between a pixel electrode layer and an active layer by one mask etching process before forming the pixel electrode layer, so as to form a via hole for connecting the pixel electrode and the source/drain electrodes of the drive transistor. The connecting electrode is provided on the pixel electrode layer, and the via hole for connecting the connecting electrode and the first and second wires is formed by sharing the above-mentioned mask etching process, thereby simplifying the manufacturing process.

In this exemplary embodiment, as shown in FIG. 4, the clock wires CLK1, CLK2, CLK3 may be formed by a hollow metal grid, and hollow areas of the metal grid may be rectangular. The orthographic projections of the connecting electrodes 11, 12, 13 on the base substrate coincide with at least part of the orthographic projection of the metal grid on the base substrate, so that the connecting electrodes 11, 12, 13 may be connected to the corresponding metal grid through the second via hole 422. As shown in FIG. 4, each clock wire may include a plurality of first metal grid lines extending in a first direction X and a plurality of second metal grid lines extending in a second direction Y. For example, the clock wire CLK1 includes a plurality of first metal grid lines 45 and second metal grid lines 46. The connecting electrode may cover multiple adjacent second metal grid lines of the same clock wire in the first direction X. For example, the connecting electrode 11 may cover a plurality of adjacent second metal grid lines 46 on the clock wire CLK1 in the first direction X; the connecting electrode may cover at least one first metal grid line in the second direction Y, for example, the connecting electrode 11 can cover two adjacent first metal grid lines 45 in the second direction Y. The array substrate may be provided with a plurality of second via holes 422 at intervals in the first direction. The orthographic projection of the second via holes on the base substrate is within the range of the orthographic projection of the metal grid on the base substrate, and the connecting electrodes may be connected to one first metal grid line of the metal grid through the plurality of second via holes. Wherein, in the first direction X, the plurality of second via holes may be correspondingly provided between every two adjacent second metal grid lines. For example, as shown in FIG. 4, three second via holes 422 are provided between every two metal grid lines. The array substrate may also be provided with a plurality of first via holes 421 at intervals in the first direction X, and the orthographic projection of the first via holes 421 on the base substrate may be located within the range of the orthographic projection of the second wire CLK1' on the base substrate. The connecting electrode 11 may be electrically connected to the second wire CLK1' through the plurality of first via holes 421. Wherein, in the first direction X, the plurality of first via holes 421 may be correspondingly provided between every two adjacent second metal grid lines. For example, as shown in FIG. 4, three first via holes 421 are provided between every two adjacent second metal grid lines 46 on the base substrate.

Figure 9:
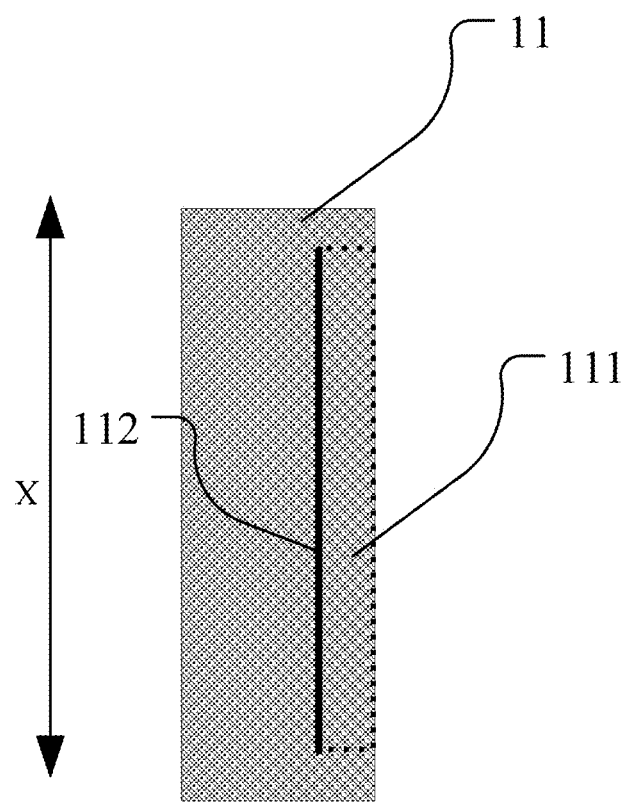
FIG. 9 is a partial enlarged view of FIG. 7.

As shown in FIG. 8, due to the manufacturing process of the array substrate, the thicknesses of positions of the second insulating layer 42 and the third conductive layer are approximately equal. Therefore, the portion 111 of the connecting electrode 11 located directly above the second wire CLK1' has a certain height difference, that is, a step difference, with respect to the connecting electrodes 11 of other parts. The boundary between the portion 111 and the other parts has a climbing structure A, and the shear stress of the connecting electrode is concentrated at the climbing structure. As shown in FIG. 6, the second wire CLK1' may include a connecting portion 61, the orthographic projection of the connecting portion 61 on the base substrate at least partly coincides with the orthographic projection of the connecting electrode on the base substrate, so that the connecting electrode 11 is connected to the second wire CLK1' through the connecting portion 61. When the connecting portion 61 only extends in the first direction X, as shown in FIG. 9 which is a partial enlarged view of FIG. 7, the portion 111 protruding from the connecting electrode 11 and a long boundary 112 in other parts (the position of the solid line, that is, an extension direction of the climbing structure) extends along the first direction X. Therefore, the shear stress of the connecting electrode 11 is mainly concentrated on the boundary 112, which easily causes the connecting electrode 11 to break along the boundary 112.

Figure 10:
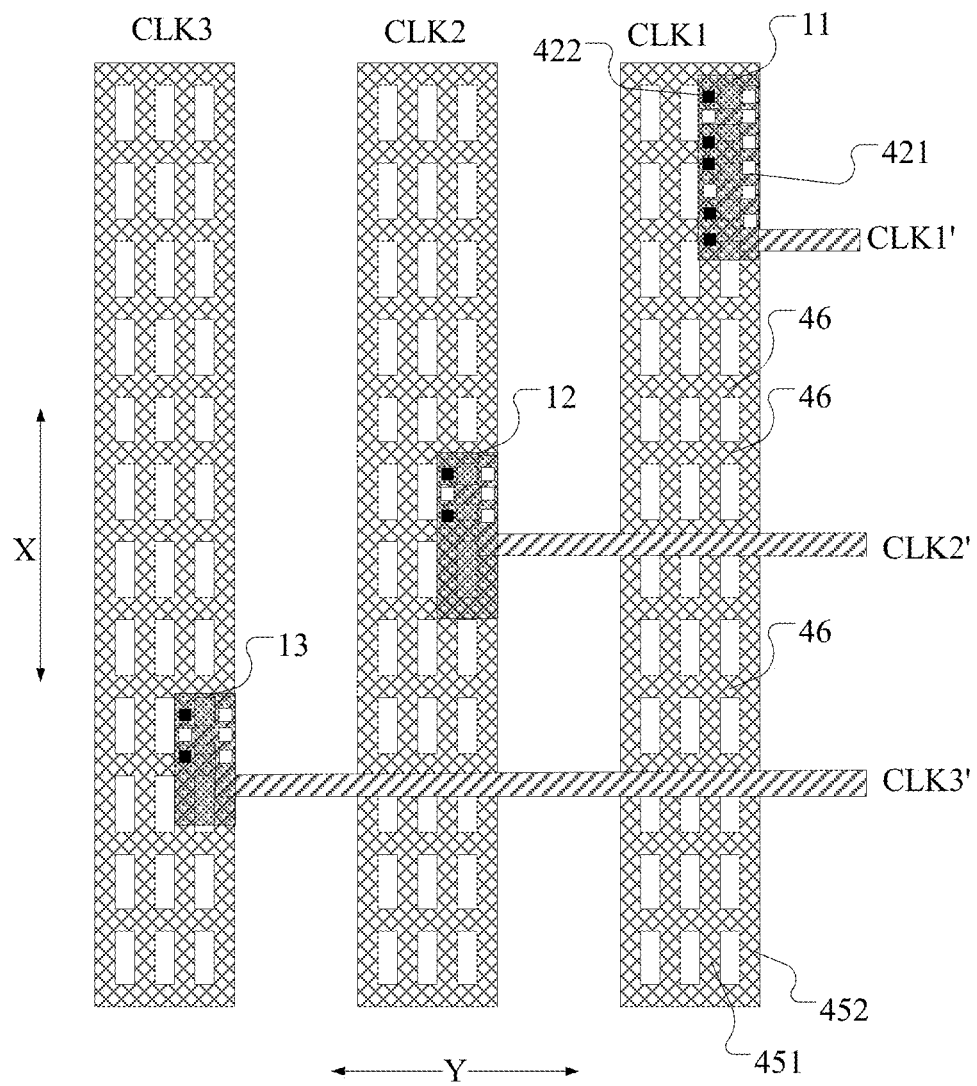
FIG. 10 is a schematic structural diagram of another exemplary embodiment of the array substrate of the present disclosure.
Figure 11:
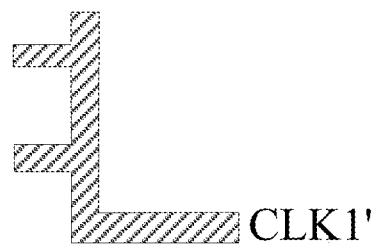
FIG. 11 is a schematic structural diagram of the second conductive layer in FIG. 10.
Figure 11:
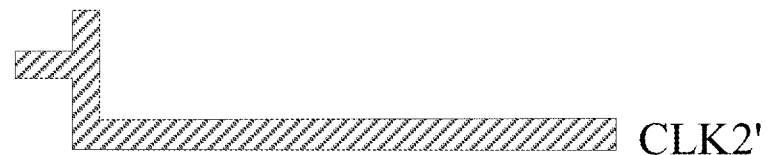
Figure 11:
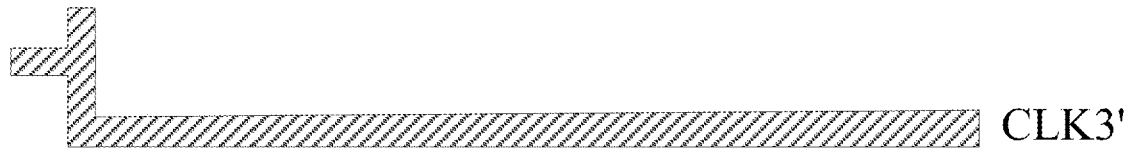
Figure 12:
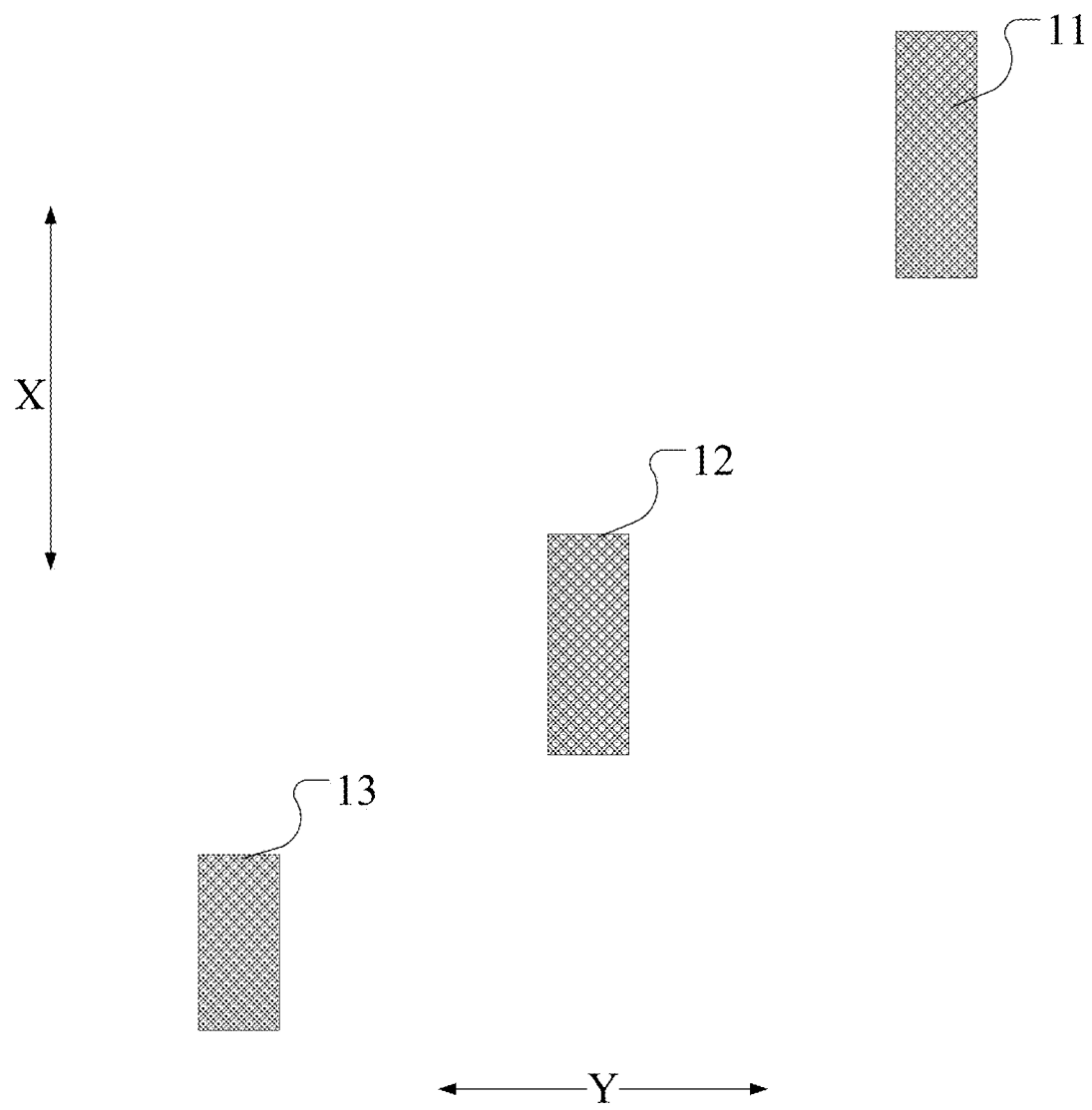
FIG. 12 is a schematic structural diagram of the third conductive layer in FIG. 10.
Figure 13:
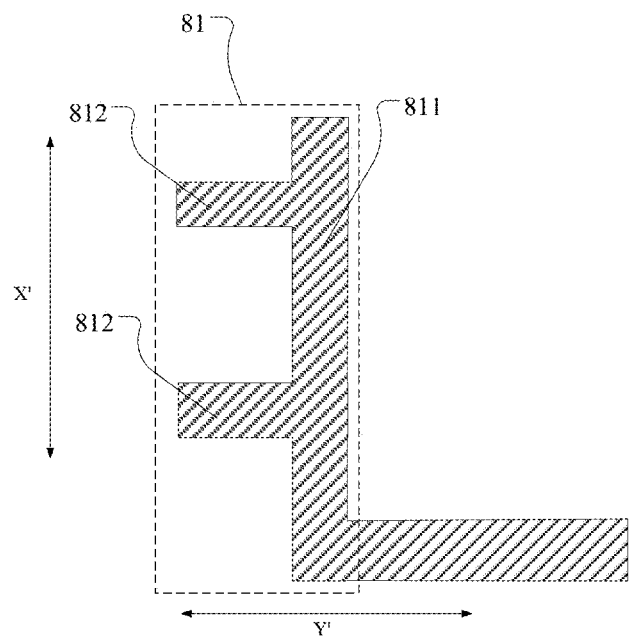
FIG. 13 is a partial enlarged view of FIG. 11.
Figure 14:
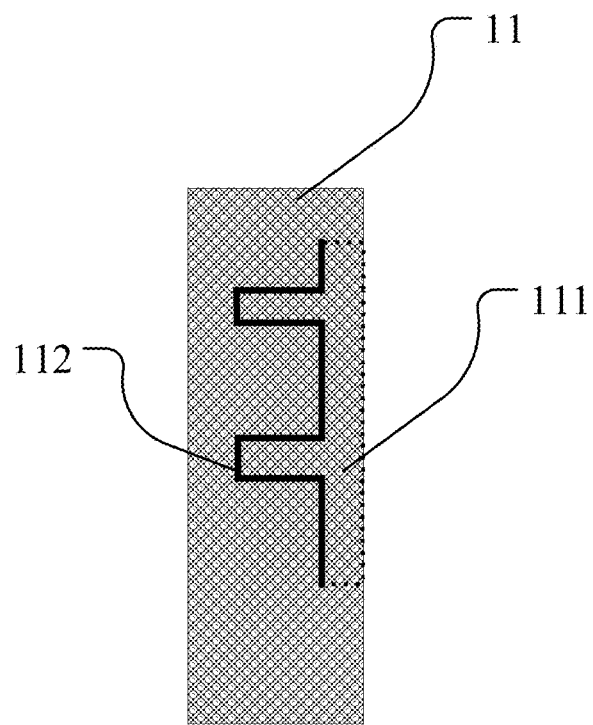
FIG. 14 is a partial enlarged view of FIG. 12.

In this exemplary embodiment, as shown in FIGS. 10, 11, 12, and 13, FIG. 10 is a schematic structural diagram of another exemplary embodiment of the array substrate of the present disclosure, FIG. 11 is a schematic structural diagram of the second conductive layer in FIG. 10, and FIG. 12 is a schematic structural diagram of the third conductive layer in FIG. 10. FIG. 13 is a partial enlarged view of FIG. 11. FIG. 14 is a partial enlarged view of FIG. 12. The main difference between the array substrate shown in FIG. 10 and the array substrate shown in FIG. 4 is that the second wires have connecting portions with different structures. As shown in FIG. 13, the second wire CLK1' may include a connecting portion 81, and the orthographic projection of the connecting portion 81 on the base substrate at least partially coincides with the orthographic projection of the connecting electrode on the base substrate. The connecting portion 81 may include a main body portion 811 extending along a third direction X' and an extension portion 812 connected to the main body portion 811, the extension portion 812 extends along a fourth direction Y', and the third direction is different from the fourth direction. As shown in FIG. 14, same as the principle of the protrusion structure of the connecting electrode in FIG. 8, the portion 111, where the orthographic projection of the connecting electrode 11 on the base substrate coincides with the orthographic projection of the connecting portion 81 on the base substrate, is a protrusion structure in a direction perpendicular to the base substrate. Since the connecting portion 81 includes the extending portion 812, as shown in FIG. 14, the convex portion 111 of the connecting electrode 11 and the boundary 112 (the solid line position, that is, the extending direction of the climbing structure) of other parts include a portion extending in the third direction and a portion extending in the fourth direction, therefore, the connecting electrode 11 can disperse its shear stress in different directions, so that the connecting electrode is not easily broken. Wherein, the connecting portion of each second wire may include a plurality of protrusions, as shown in FIG. 11, and the second wire CLK1' may include two protrusions, each of the second wire CLK2' and the second wire CLK3' may include one protrusion. In this exemplary embodiment, the third direction may be the same as the extension direction of the first wire, and the fourth direction may be the same as the extension direction of the second wire.

As shown in FIGS. 10 and 13, the connecting electrode 11 may be connected to the first wire CLK1 through the second via hole 422, and the connecting electrode may be connected to the second wire CLK1' through the first via hole 421. As shown in FIG. 10, the white square hole represents the first via hole 421, and the black square hole represents the second via hole 422. Each clock wire may include a plurality of first metal grid lines extending in the first direction X and a plurality of second metal grid lines extending in the second direction Y. For example, the clock wire CLK1 includes a plurality of first metal grid lines and a plurality of second metal grid lines 46, wherein the plurality of first metal grid lines include adjacent first metal grid lines 451 and 452. The array substrate may be provided with a plurality of second via holes 422 at intervals in the first direction. The orthographic projection of the second via holes 422 on the base substrate is located within the range of the orthographic projection of the first metal grid line 451 on the base substrate, and the connecting electrode may be connected to the first metal grid line 451 through a plurality of second via holes 422. The orthographic projection of the main body portion 811 of the second wire CLK1' on the base substrate may be located within the range of the orthographic projection of the first metal grid line 452 on the base substrate, and the array substrate may be provided with a plurality of first via holes 421 at intervals in the first direction. The orthographic projection of the first via holes 421 on the base substrate may be located within the range of the orthographic projection of the main body portion 811 of the second wire CLK1' on the base substrate, and the connecting electrode 11 may be electrically connected to the main body portion 811 of the second wire CLK1' through the plurality of first via holes 421. The extension portion 812 of the second wire CLK1' may extend along the second direction Y, so that the orthographic projection of the extension portion 812 on the base substrate at least partly coincides with the orthographic projection of the first metal grid line 451 on the base substrate, so that the first via holes 421 may be provided between the second via holes 422.

It should be understood that the via holes between the connecting electrode 11, the first wire CLK1 and the second wire CLK1' may also be arranged in other ways. At the same time, the via hole arrangement of other correspondingly connected connecting electrodes, the first wires, and the second wires may be the same as the connecting electrode 11, the first wire CLK1 and the second wire CLK1'.

Figure 15:
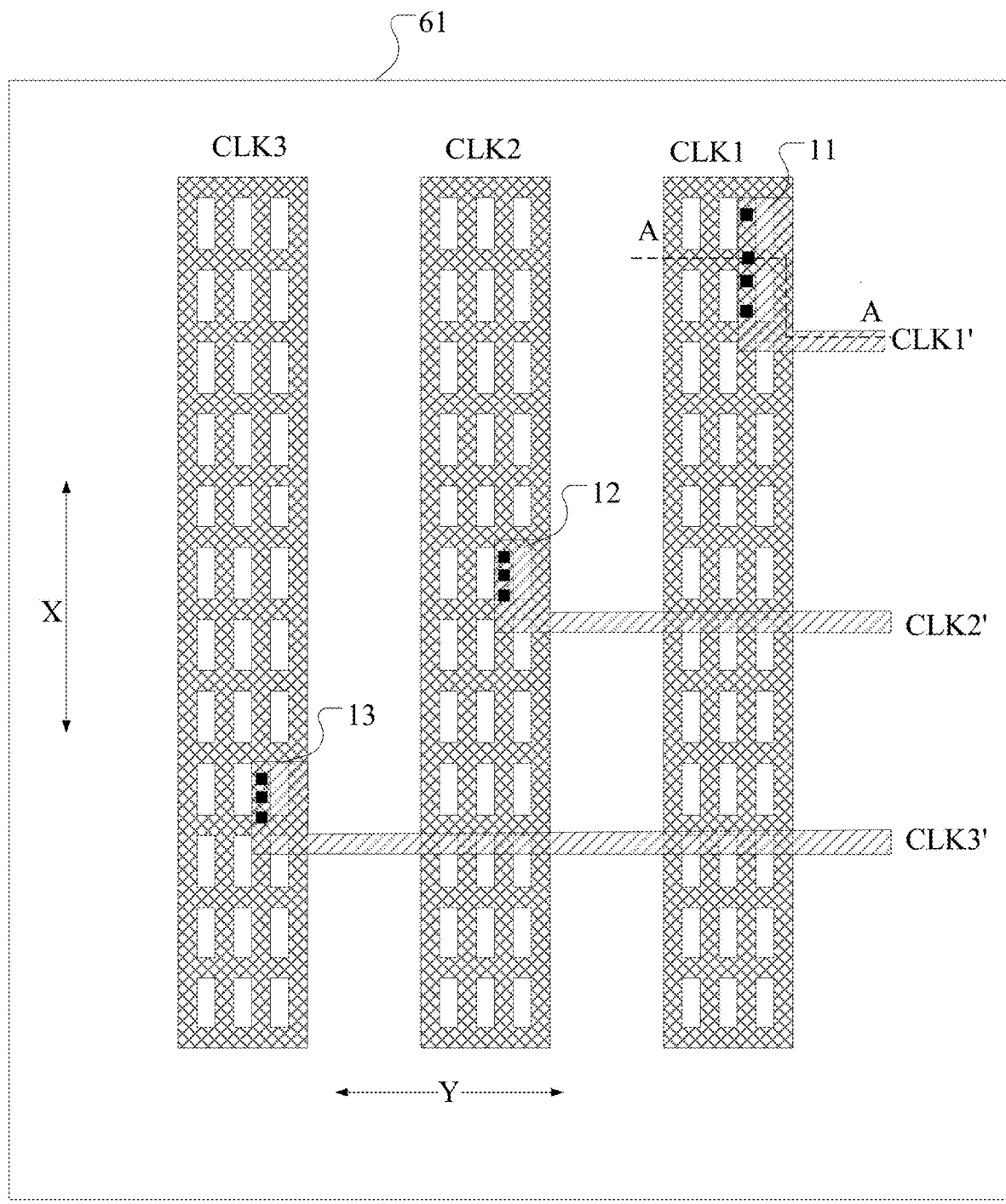
FIG. 15 is a schematic structural diagram of another array substrate of the present disclosure.
Figure 16:
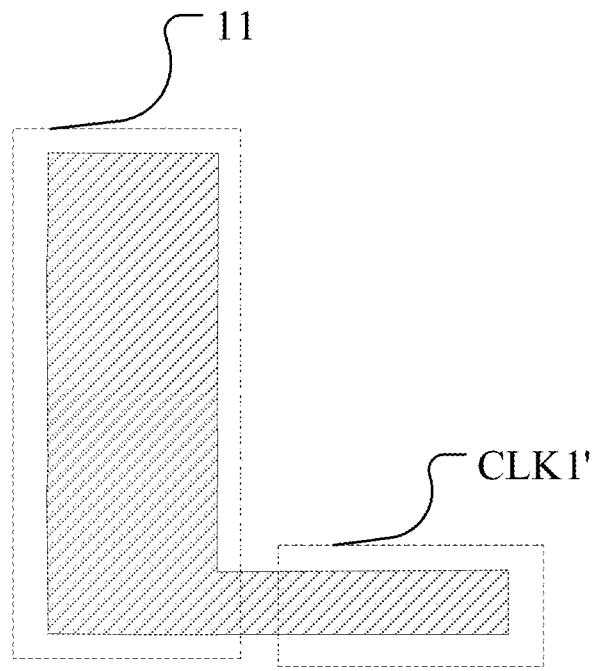
FIG. 16 is a partial enlarged view of second wires CLK1' in FIG. 15.
Figure 17:
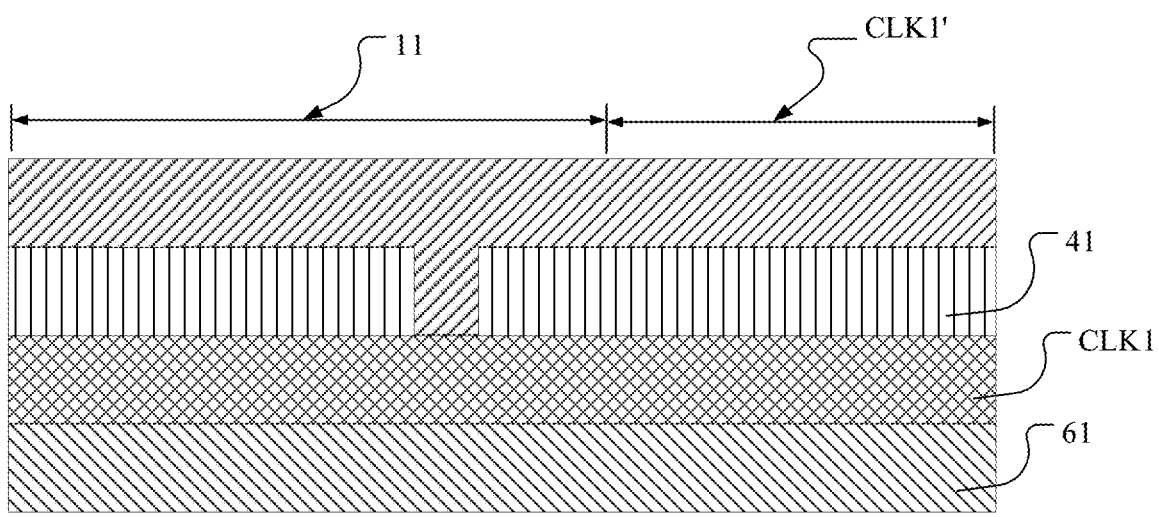
FIG. 17 is a cross-sectional view at the dotted line A-A in FIG. 15.

It should be understood that, in other exemplary embodiments, the first conductive layer and the second conductive layer may also be provided on other conductive layers. The third conductive layer may also be located on other conductive layers. For example, as shown in FIGS. 15, 16, 17, FIG. 15 is a schematic structural diagram of another array substrate of the present disclosure, FIG. 16 is a partial enlarged view of second wire CLK1' in FIG. 15, and FIG. 17 is a cross-sectional view at the dotted line A-A in FIG. 15. The array substrate may include: a base substrate 61, a plurality of first wires CLK1, CLK2, CLK3, a plurality of second wires CLK1', CLK2', CLK3', and a plurality of connecting electrodes 11, 12, 13. A plurality of first wires are provided on the first conductive layer; a plurality of second wires are provided on the second conductive layer, and the first conductive layer and the second conductive layer are located in different layers; and a plurality of connecting electrodes are disposed on the third conductive layer. The connecting electrodes are respectively connected to the first and second wires to connect the corresponding first and second wires. As shown in FIG. 15, the first wire CLK1 may be connected to the second wire CLK1' by the connecting electrode 11, the first wire CLK2 may be connected to the second wire CLK2' by the connecting electrode 12, and the first wire CLK3 may be connected to the second wire CLK3' by the connecting electrode 13, wherein the orthographic projection areas of the connecting electrodes on the base substrate are not exactly the same. As shown in FIGS. 16 and 17, the third conductive layer may be arranged in the same layer as the second conductive layer, that is, formed by one single patterning process. The first wire CLK1 is provided on one side of the base substrate 61, and a first insulating layer 41 is provided on one side of the first wire CLK1 away from the base substrate 61, and the connecting electrode 11 may be located on one side of the first wire CLK1 away from the base substrate 61; the connecting electrode 11 may be connected to the first wire CLK1 through a via hole penetrating the first insulating layer 41, and connected to the second wire CLK1' in the same layer.

In this exemplary embodiment, as shown in FIG. 4, a plurality of the first wires may extend in the first direction X and be distributed at intervals in the second direction Y, and the second wires may extend in the second direction Y and be distributed at intervals in the first direction X, wherein the first direction X is different from the second direction Y. Since the first wires and the second wires are arranged crosswise, in order to prevent the second wires from being short-circuited with the unnecessarily connected first wires, the second wires and the first wires need to be arranged on different conductive layers.

Figure 18:
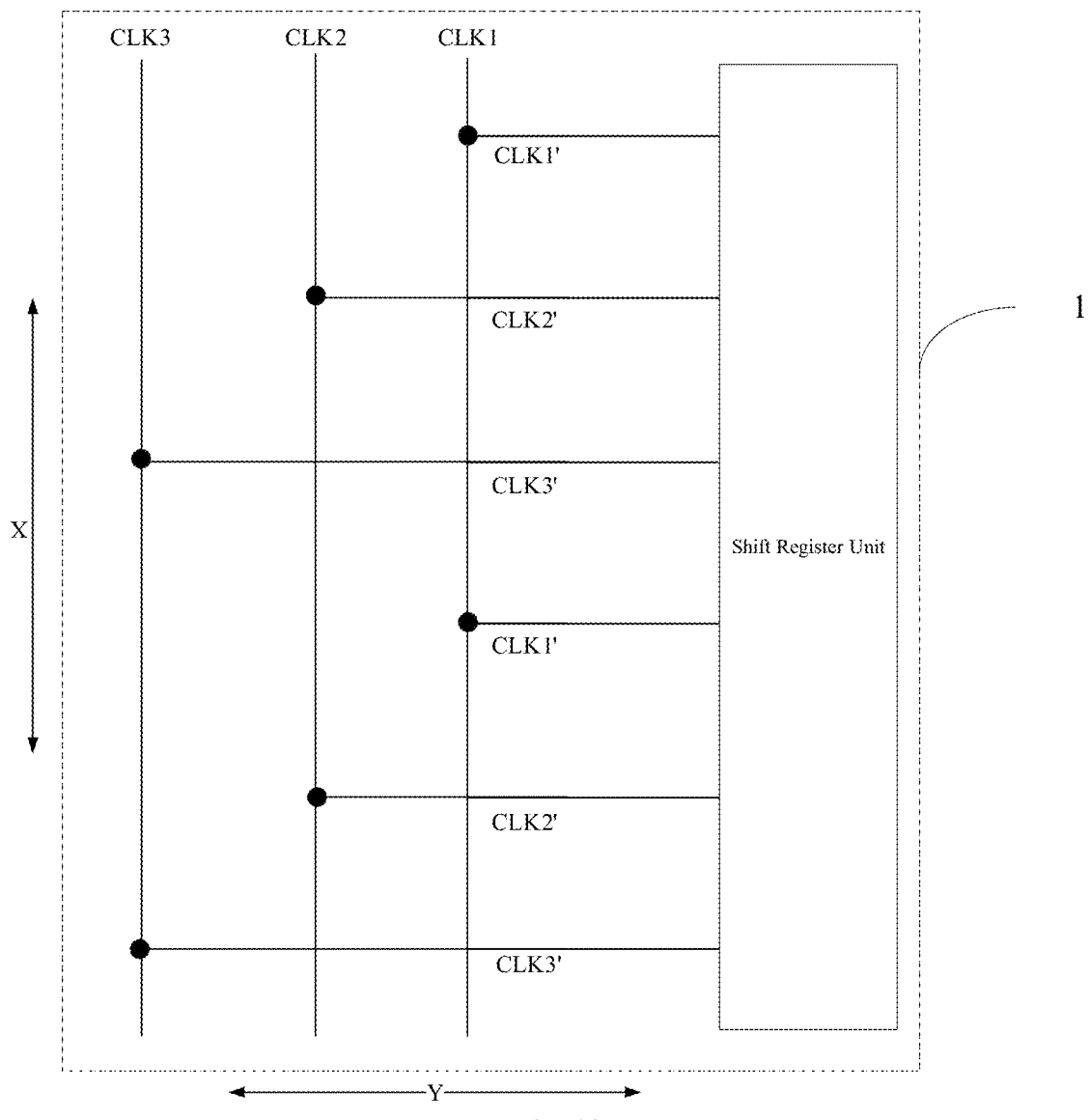
FIG. 18 is a schematic structural diagram of an array substrate of an exemplary embodiment of the present disclosure.

In this exemplary embodiment, as shown in FIG. 18, the array substrate may include an edge wiring area 1, the first wires and the second wires may be located in the edge wiring area 1, and the first ends of the second wires are connected to the first wires, and the second ends of the second wires extend to the edge of the edge wiring area.

In this exemplary embodiment, as shown in FIG. 4, the clock wire may be formed by a hollow metal grid. This structure can also facilitate curing encapsulation glue by external ultraviolet rays penetrating the array substrate when the display panel is packaged in a box.

The exemplary embodiment also provides a display panel including the above-mentioned array substrate.

This exemplary embodiment also provides a display device including the above-mentioned array substrate. The display device may be a display device such as a TV, a mobile phone, a tablet computer, etc.

Those of ordinary skill in the art will easily think of other embodiments of the present disclosure after considering the specification and practicing the disclosure disclosed herein. This application is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are pointed out by the claims.

It should be understood that the present disclosure is not limited to the precise structure that has been described above and shown in the drawings, and various modifications and changes can be made without departing from its scope. The scope of the present disclosure is limited only by the appended claims.

What is claimed is:

1. An array substrate, comprising:
   a base substrate;
   a first conductive layer on a side of the base substrate, comprising a plurality of first wires, wherein the first wires are clock wires in a gate drive circuit;
   a second conductive layer on a side of the base substrate, comprising a plurality of second wires, the first conductive layer and the second conductive layer being located in different layers, the plurality of second wires having at least a first length and a second length, the first length being less than the second length, wherein the second wires are clock lead wires in the gate drive circuit; and
   a third conductive layer on a side of the base substrate, comprising a plurality of connecting electrodes, and the connecting electrodes being respectively connected to the first wires and the second wires so as to connect corresponding first wires and second wires, an orthographic projection, on the base substrate, of a connecting electrode connected to a second wire having the first length having a first area, and an orthographic projection, on the base substrate, of a connecting electrode connected to a second wire having the second length having a second area;
   wherein the first area is greater than the second area.

2. The array substrate according to claim 1, wherein
   a sum of an overlap capacitance generated between each of the second wires and a target structure layer and an overlap capacitance generated between the connecting electrode connected to the second wires and the target structure layer are equal.

3. The array substrate according to claim 1, wherein the third conductive layer, the first conductive layer and the second conductive layer are located in different layers, and the connecting electrodes are connected to the first wires and the second wires through via holes.

4. The array substrate according to claim 1, wherein the array substrate comprises a transistor, and the first conductive layer comprises a gate layer for forming a transistor gate electrode, and the second conductive layer comprises a source/drain layer for forming a transistor source/drain electrode;
   the array substrate comprises a pixel electrode, and the third conductive layer comprises a pixel electrode layer for forming the pixel electrode.

5. The array substrate according to claim 1, wherein
   the second conductive layer is located on a side of the first conductive layer away from the base substrate;
   the third conductive layer and the second conductive layer are provided in the same layer, and the connecting electrodes are connected to the first wires through via holes, and connected to the second wires in the same layer.

6. The array substrate according to claim 1, wherein the plurality of first wires extend in a first direction and are distributed at intervals in a second direction, and the second wires extend in the second direction and are distributed at intervals in the first direction, wherein the first direction is different from the second direction.

7. The array substrate according to claim 6, wherein the array substrate comprises an edge wiring area, wherein the first wires and the second wires are located in the edge wiring area, and first ends of the second wires are connected to the first wires, and second ends of the second wires extend to an edge of the edge wiring area.

8. The array substrate according to claim 7, wherein
   the first wires extend along a cascade direction of a shift register unit in the gate drive circuit, and are configured to provide clock signals to the shift register unit;
   the first ends of the second wires are connected to the first wires, and the second ends of the second wires extend to the edge of the edge wiring area so as to connect to the shift register unit in the gate drive circuit.

9. The array substrate according to claim 8, wherein the first wires are formed by a hollow metal grid, and the orthographic projection of the connecting electrodes on the array substrate at least coincides with the orthographic projection of a part of the metal grid on the base substrate.

10. The array substrate according to claim 3, wherein the second wire comprises a connecting portion, and the orthographic projection of the connecting portion on the base substrate at least partly coincides with the orthographic projection of the connecting electrode on the base substrate;
   the connecting portion comprises a main body portion extending in a third direction and an extension portion connected to the main body portion, the extension portion extends in a fourth direction, and the third direction is different from the fourth direction.

11. A display device, wherein the display device comprises the array substrate according to claim 1.

12. A display device, wherein the display device comprises the array substrate according to claim 2.

13. A display device, wherein the display device comprises the array substrate according to claim 3.

14. A display device, wherein the display device comprises the array substrate according to claim 4.

15. A display device, wherein the display device comprises the array substrate according to claim 5.

16. A display device, wherein the display device comprises the array substrate according to claim 6.

17. A display device, wherein the display device comprises the array substrate according to claim 7.

18. A display device, wherein the display device comprises the array substrate according to claim 8.

19. A display device, wherein the display device comprises the array substrate according to claim 9.

20. A display device, wherein the display device comprises the array substrate according to claim 10.

* * * * *